United States Patent [19]

Kirpich

[11] Patent Number: 4,491,681
[45] Date of Patent: Jan. 1, 1985

[54] LIQUID COOLED, LINEAR FOCUS SOLAR CELL RECEIVER

[75] Inventor: Aaron S. Kirpich, Broomall, Pa.

[73] Assignee: The United States of America as represented by the United States Department of Energy, Washington, D.C.

[21] Appl. No.: 559,504

[22] Filed: Dec. 8, 1983

[51] Int. Cl.³ .............................................. H01L 31/00
[52] U.S. Cl. .................................... 136/246; 136/244; 136/248; 136/251
[58] Field of Search ................. 136/244, 246, 248, 251

[56] References Cited

U.S. PATENT DOCUMENTS

| | | | |
|---|---|---|---|
| 3,376,164 | 4/1968 | Bachwansky | 136/251 |
| 3,952,324 | 4/1976 | Wolff et al. | 357/19 |
| 4,056,405 | 11/1977 | Varadi | 136/246 |
| 4,180,414 | 12/1979 | Diamond | 136/246 |
| 4,334,120 | 6/1982 | Yamano et al. | 136/248 |
| 4,361,717 | 11/1982 | Gilmore et al. | 136/246 |
| 4,388,481 | 6/1983 | Uroshevich | 136/246 |
| 4,397,303 | 8/1983 | Stultz | 126/442 |

FOREIGN PATENT DOCUMENTS 2950274 6/1981 Fed. Rep. of Germany ...... 136/246

OTHER PUBLICATIONS

M. Simon et al., "Solar Cells With Concentrating Collectors & Integrated Heat Use System", *Proceedings, 2nd E. C. Photovoltaic Solar Energy Conf.*, Reidel Pub. Co., (1979), pp. 541–549.
M. J. O'Leary et al., "Thermal-Electric Performance Analysis for Actively Cooled, Concentrating Photovoltaic Systems", *Solar Energy*, vol. 25, pp. 401–406, (1980).
M. J. O'Neill, "The 25 KW Fresnel Lens/Photovoltaic Concentrator Application Experiment at Dallas-Fort Worth Airport", *Conf. Record, 14th IEEE Photovoltaic Specialists Conf.*, (1980), pp. 125–130.
K. T. Feldman, Jr., "A Passive Heat Pipe Cooled Photovoltaic Receiver", *Conf. Record, 15th IEEE Photovoltaic Specialists Conf.*, (1981), pp. 165–172.

*Primary Examiner*—Aaron Weisstuch
*Attorney, Agent, or Firm*—James H. Chafin; Albert Sopp; Michael F. Esposito

[57] ABSTRACT

Separate structures for electrical insulation and thermal conduction are established within a liquid cooled, linear focus solar cell receiver for use with parabolic or Fresnel optical concentrators. The receiver includes a V-shaped aluminum extrusion having a pair of outer faces each formed with a channel receiving a string of solar cells in thermal contact with the extrusion. Each cell string is attached to a continuous glass cover secured within the channel with spring clips to isolate the string from the external environment. Repair or replacement of solar cells is effected simply by detaching the spring clips to remove the cover/cell assembly without interrupting circulation of coolant fluid through the receiver. The lower surface of the channel in thermal contact with the cells of the string is anodized to establish a suitable standoff voltage capability between the cells and the extrusion. Primary electrical insulation is provided by a dielectric tape disposed between the coolant tube and extrusion. Adjacent solar cells are soldered to interconnect members designed to accommodate thermal expansion and mismatches. The coolant tube is clamped into the extrusion channel with a releasably attachable clamping strip to facilitate easy removal of the receiver from the coolant circuit.

16 Claims, 7 Drawing Figures

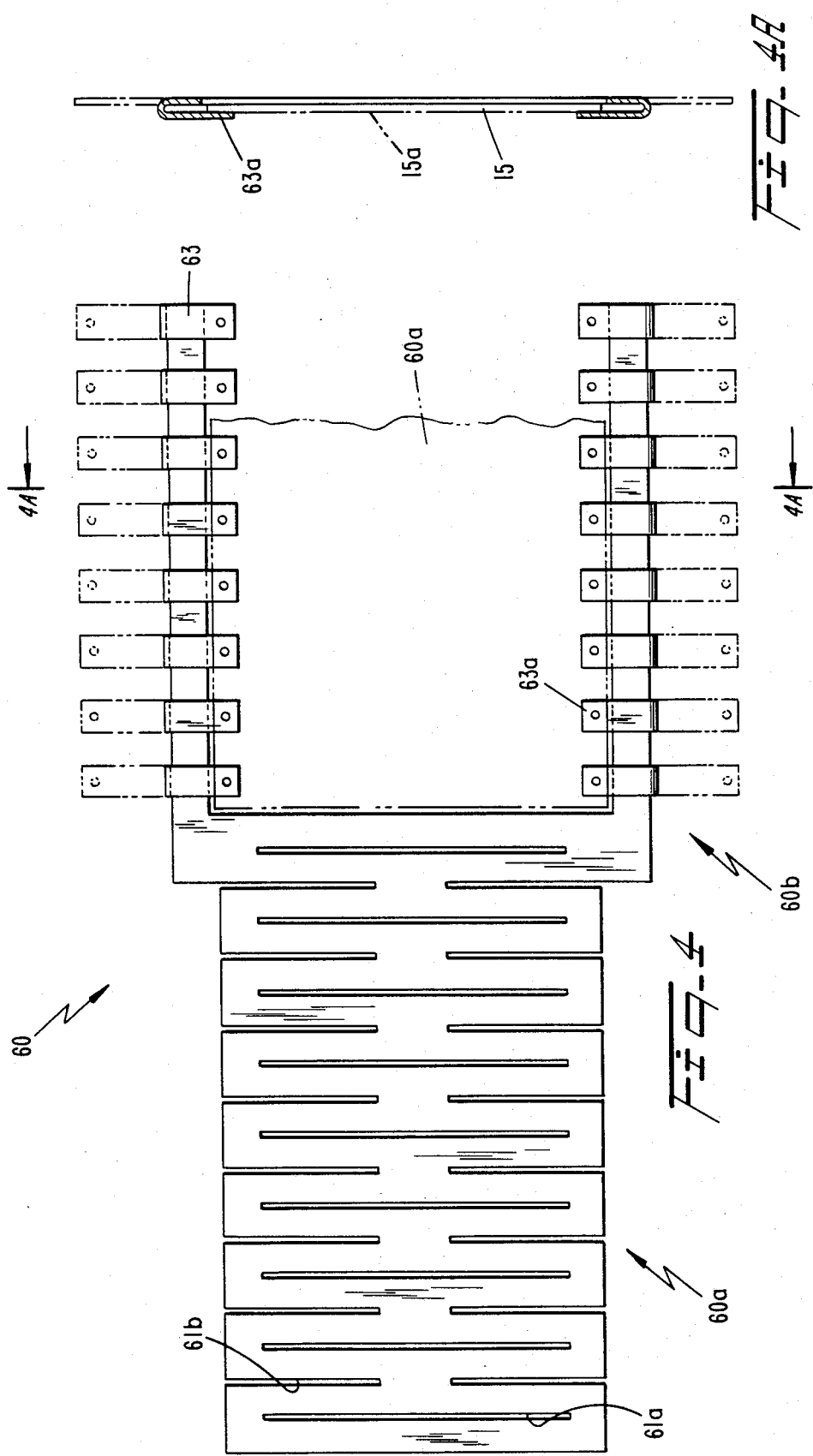

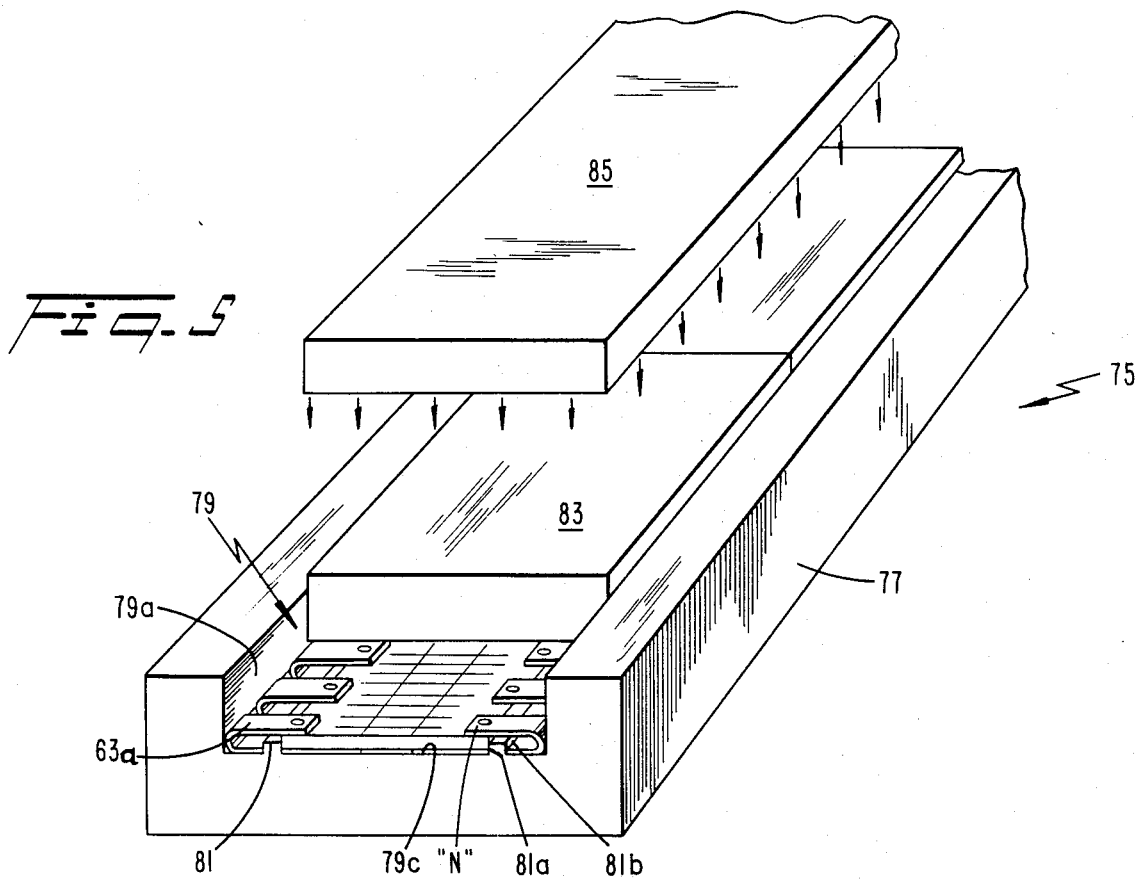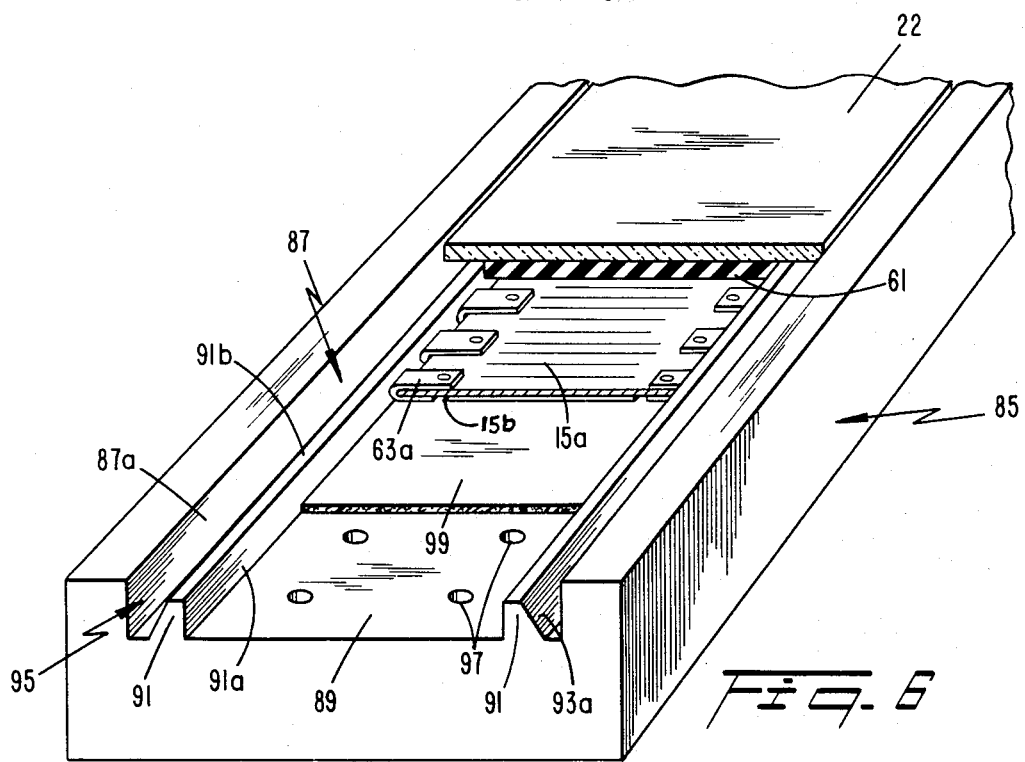

LIQUID COOLED, LINEAR FOCUS SOLAR CELL RECEIVER

The U.S. Government has rights in this invention pursuant to contract number DE-AC04-80ET20627 between the U.S. Department of Energy and General Electric Company. (41 CFR 9-9.109-6(i)(5)(II)(b)).

BACKGROUND OF THE INVENTION

This invention relates generally to solar cell receivers that house solar energy cells mounted for exposure to sunlight and, more particularly, to a liquid cooled linear focus solar cell receiver in which are established separate structures for establishing electrical insulation and thermal conduction.

Solar photovoltaic cells are semiconductor devices producing, when illuminated, a voltage across their output terminals. In linear-focus type receivers, a plurality of solar cells are interconnected to produce a desired voltage required to operate a load or to be stored in a battery. During exposure to sunlight, these cells as well as the receiver structure tend to heat up due to solar energy impinging on each cell. The solar cells are mounted in thermal contact with a heat conductive supporting structure to transmit heat for removal by a circulating fluid charged within a coolant tube in contact with the receiver.

Solar cells tend to have a lower conversion efficiency at higher operating temperatures. Thus, under strong light concentration, impinging on the cells, the electrical output is lower than expected. To function optimally, excellent heat transfer conditions between the cells and their supporting structure must prevail while maintaining electrical insulation therebetween.

In many conventional solar cell receivers, electrical insulation is satisfied by inserting an insulating material between the solar cell circuit and its structural support functioning as a heat sink. Since it is also desirable to remove heat from the solar cells with minimum temperature drop, such prior art receiver designs generally utilize expensive insulating materials such as alumina or beryllia which combine good electrical insulation with moderate thermal conductivity. However, since optical concentrating systems often result in peak fluxes occurring at or near the central region of the cells, the use of such insulating materials in this region results in significant temperature drops, impairing electrical generation efficiency of the cells as well as increasing the likelihood of thermal expansion. In view of different thermal expansion rates between the cells and mounting structure of the receiver, warping between the cells and mounting structure or thermal mismatch between adjacent cells is likely to occur.

Another problem associated with prior art receiver designs is the difficulty in effecting repair or replacement of faulty cells which impair electrical generation performance. This is because the cells are usually hand bonded to their structural support heat sink, requiring removal from the receiver and interruption of the coolant circuit.

SUMMARY OF THE INVENTION

Accordingly, it is a primary object of the present invention to provide a liquid cooled, linear focus solar cell receiver having separate electrical insulation and thermal conduction structures.

Another object of the invention is to provide a liquid cooled, linear focus solar cell receiver using low cost electrical insulation materials with excellent thermal conductivity to electrically insulate the cells from the receiver while minimizing temperature drop.

Another object of the invention is to provide such a receiver wherein the solar cells are capable of easy removal from the receiver for ease of repair or replacement without interrupting the liquid coolant circuit.

Still another object is to provide a receiver having means for accommodating thermal expansion between the solar cells and receiver mounting structure while maintaining effective seals preventing entry of moisture into the cells.

Yet a further object is to provide a receiver that is economical to manufacture and easily disassembled from the coolant tube for repair or replacement without interrupting the liquid coolant circuit.

Still another object is to provide a receiver capable of reliable operation in rugged and hostile environments.

Additional objects, advantages, and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved liquid cooled, linear focus solar cell receiver comprises a plurality of solar cells electrically connected in series with each other to form a cell string having surfaces in thermal contact with a heat conductive member. Upper, exposed surfaces of the solar cells are attached to a transparent cover mounted on the heat conductive member to isolate the cells from the external environment. Spring clips releasably secure the cover in sealing engagement with the conductive member to facilitate easy removal of the cover and attached solar cells from the receiver to effect repair as well as to permit thermal expansion. A coolant tube charged with coolant fluid is disposed in thermal contact with the heat conductive member. Interpositioned between the conductive member and coolant tube, a dielectric tape provides primary electrical insulation between the cells and the tube without impairing thermal conductivity.

More specifically, the heat conductive member includes an inverted V-shaped aluminum extrusion having a pair of outer faces each formed with a channel extending longitudinally to receive the glass/solar cell assembly therewithin. Each channel includes a pair of substantially parallel side walls and a bottom wall defining a pair of cover supporting surfaces cooperating with the side walls to accurately position the cover in the channel. The bottom wall of the channel also includes a substantially flat abutment surface extending between and below the elevational position of the support surfaces to thermally contact the lower surfaces of the solar cell.

The flat abutment surface is preferably anodized to provide a suitable stand off voltage capability between the cells and extrusion, providing electrical insulation therebetween without affecting heat transferability.

To connect adjacent solar cells in series while permitting thermal expansion within the receiver, interconnect members include a lower connecting section and a pair of arms projecting longitudinally to define an upper connecting section. The lower section is soldered to the center one-third of the lower surface of a solar cell to enhance heat transfer to the underlying extrusion. The upper arms include transversely extending fingers curved to engage the upper or exposed side of an adjacent solar cell. The arms are laterally spaced from each other by a distance greater than the width of the lower section of the interconnect member, enabling interpositioning of the adjacent solar cell therebetween in contact with the lower section of an adjacent interconnect member. The lower sections include transversely extending alternating slots to accommodate thermal expansion between the cells and the extrusion.

To position the coolant tube in thermal contact with the receiver, a concave shaped channel is formed lengthwise along interior surfaces of the extrusion. The tube is clamped within the channel by a V-shaped retainer clip spring loaded to press against a clamping strip engaging outer surfaces of the tube. Clamping facilitates removal of the solar cells/extrusion assembly from the tube without interrupting the coolant circuit. A grounded metal cover containing insulation covers lower, exposed surfaces of the extrusion to prevent contact by personnel as well as prevent heat from escaping through the back of the receiver.

The midpoint of each cell string is preferably electrically connected to the extrusion. In the event of cell malfunction or shadowing, the extrusion establishes a current bypass path.

Still other objects of the present invention will become readily apparent to those skilled in this art from the following description wherein there is shown and described a preferred embodiment of this invention, simply by way of illustration of one of the modes best suited to carry out the invention. As it will be realized, the invention is capable of other different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWING

FIG. 3 is a simplified electrical diagram illustrating interconnection of the receiver cell string to the extrusion forming a current bypass path;

FIG. 4 is a top plan view of an electrical interconnect used to connect adjacent solar cells in series;

FIG. 4A is a sectional view taken along the line 4A—4A of FIG. 4 to further illustrate electrical connection of adjacent cells;

FIG. 5 is a perspective view of a soldering jig for use in soldering adjacent cells and their interconnects together in proper alignment; and FIG. 6 is a perspective view of a bonding fixture used to attach the cell/interconnect arrangement to the continuous glass cover.

DETAILED DESCRIPTION OF THE INVENTION

Figure 1:
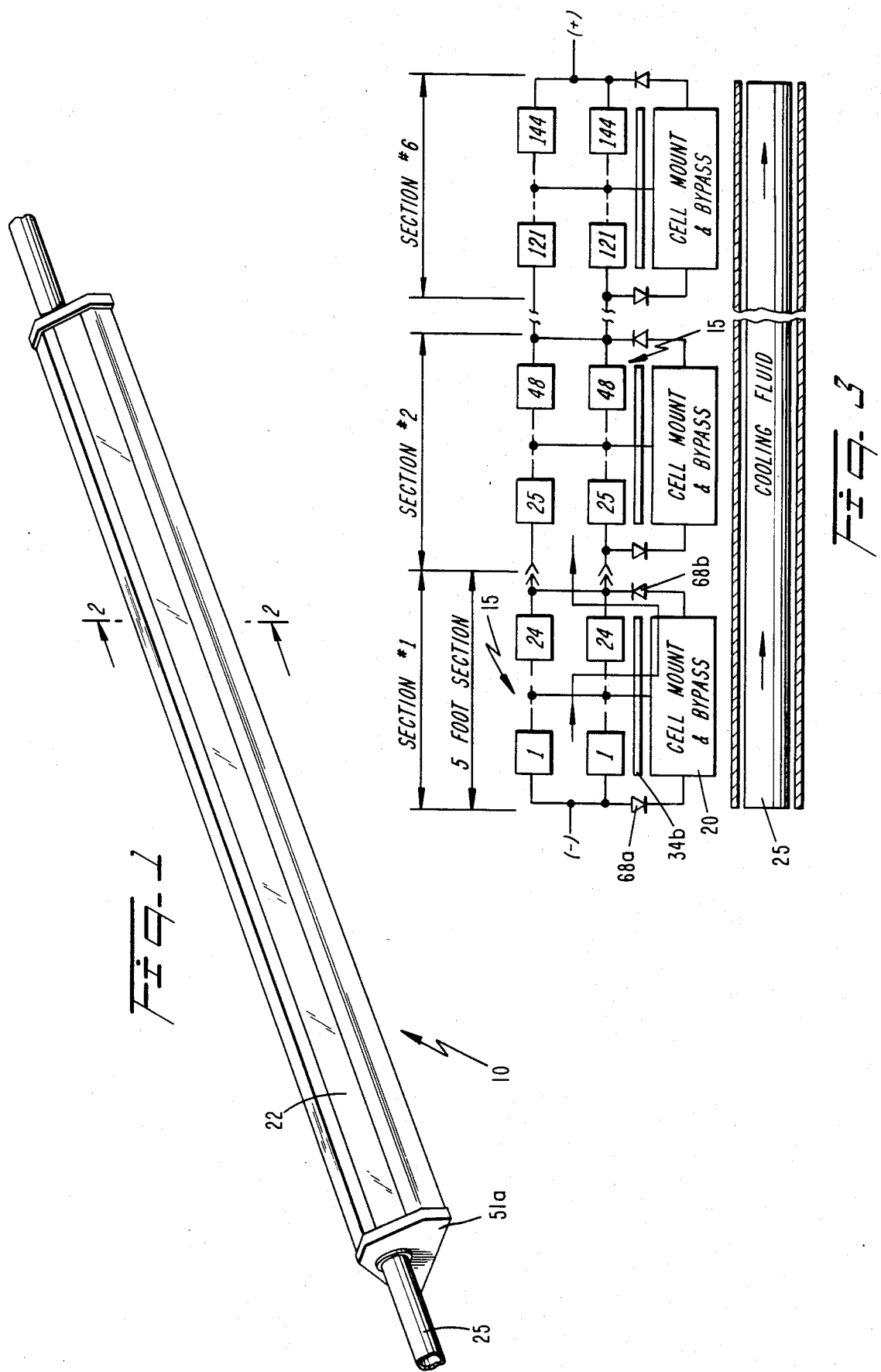
FIG. 1 is a perspective view of the liquid cooled, linear focus solar cell receiver constructed in accordance with the present invention.
Figure 2:
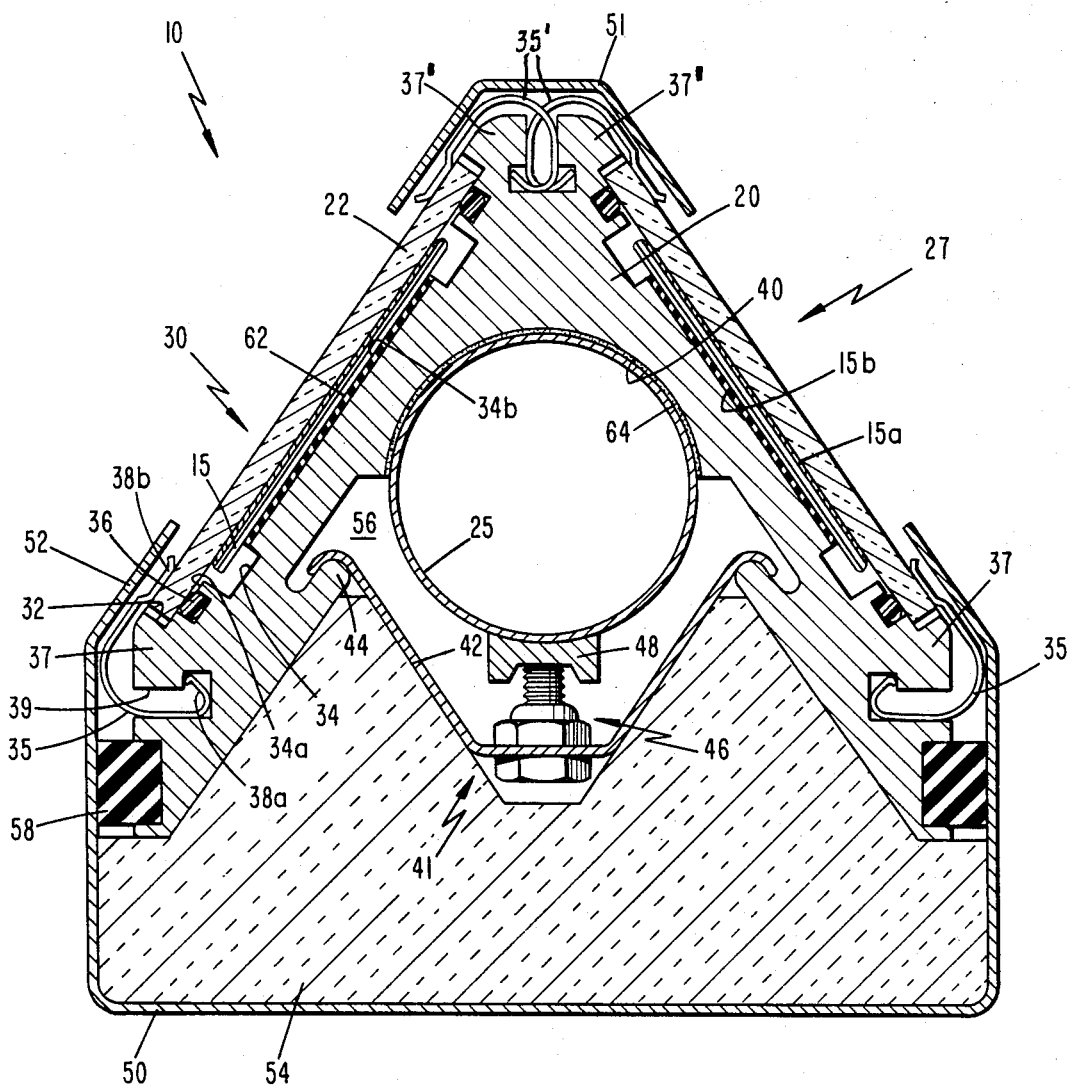
FIG. 2 is a detailed sectional view taken along the line 2—2 of FIG. 1 illustrating positioning and electrical insulation of solar cell strings with respect to the heat conductive extrusion and coolant tube.

Referring to FIGS. 1 and 2, a liquid-cooled, linear focus solar cell receiver 10 for two-axis tracking parabolic trough or linear Fresnel optical concentrators in accordance with the invention is shown. Receiver 10 comprises two solar cell strings 15 (FIG. 3), each containing twenty four solar cells mounted to and in close thermal contact with a heat conductive V-shaped extrusion 20, preferably formed of aluminum. A continuous glass cover 22 isolates each cell string 15 from environmental moisture and contamination. Extrusion 20 is clamped into thermal contact with a coolant tube 25 through which a coolant fluid, such as water, circulates. Heat removal effected by the circulating coolant both reduces solar cell operating temperatures, improving conversion efficiency, and serves as a thermal byproduct for other uses such as water heating. In accordance with the unique features described below, solar cell strings 15 are mounted within receiver 10 in a manner in which electrical insulation and thermal conduction functions are separated, permitting use of low cost materials, as well as facilitating removal of the solar cell extrusion assembly for ease of repair or replacement without requiring interruption of the liquid coolant circuit.

As illustrated in FIG. 2, extrusion 20 includes a pair of outer faces 27 each formed with a channel 30 receiving one cell string 15 and cover 22 in thermal contact with each other. Each channel 30 extends the full length of extrusion 20 and includes parallel sidewalls 32 and a bottom wall 34. Outer edges of bottom wall 34 extending lengthwise adjacent sidewalls 32 define a pair of support surfaces 34a receiving and supporting corresponding edges of cover 22. A flat abutment surface 34b extends transversely between and below cover supporting surfaces 34a, enabling cell string 15 to be positioned beneath the cover to contact the abutment surface in heat exchange relationship with the extrusion.

A silicon rubber tube 36 is positioned within grooves formed in support surfaces 34a to prevent moisture from entering receiver 10 along side edges of cover 22. Spring clips 35 and 35', having one hooked end 38a retained within an L-shaped anchoring hole 39 formed at spaced intervals within each apex 37 of extrusion 20 and an opposite end 38b bearing against the outer surface of cover 22, press the cover into contact with tubes 36 while also pressing each cell string 15 into thermal contact with the extrusion. Clips 35, 35', being easily detachable from extrusion 20, facilitate repair or replacement of defective solar cells as well as permit thermal expansion of the cover/cell string assembly.

To mount coolant tube 25 within receiver 10, extrusion 20 includes a downwardly facing, longitudinal channel 40 that is concave and retained in close thermal contact with the tube 25 by a clamping means 41. Clamping means 41 preferably includes a resilient curved retainer clip 42 having hooked ends engaging inwardly extending projections 44 of extrusion 20. A clamping screw 46 threaded to retainer clip 42 urges a clamping strip 48 tightly against the exposed surface of coolant tube 25, pressing the tube securely against the extrusion.

To protect personnel from contacting extrusion 20, an electrically grounded metal shield 50 extends along the entire lower surface of the extrusion and around the lower apices 37 thereof. A nose shield 51 envelopes the upper apex 37'; of extrusion 20, as shown in FIG. 2. Inwardly extending side edges 52 of cover 50 extend around clips 35 and lower edges of glass cover 22 to retain the grounded metal shield 50 to the back of receiver 10. Sealing boots 51a respectively mounted at opposite ends of extrusion 20 provide additional protection against contact by personnel, as well as prevent moisture entry into the receiver.

Shield 50 also defines an enclosure with inner surfaces of extrusion 20 and outer surfaces of retainer clip 42 filled with thermal insulation 54. Insulation 54 is effective to prevent loss of thermal energy through the back of receiver 10. A dead air space cavity 56 formed between the outer surface of tube 25 and inner surfaces of clip 42 cooperate with insulation 54 to provide the necessary thermal barrier. Sealing strips 58 positioned between extrusion 20 and shield 50 prevent moisture from penetrating into the back of receiver 10 between side edges 52 and clips 35.

Each solar cell string 15 includes, in the embodiment shown, twenty-four solar cells, connected in series by interconnect members 60, described below. The exposed side 15a of each solar cell is bonded to the inner surface of glass cover 22 with a low cost, transparent silicone rubber or alternative adhesive layer 61, as shown in FIG. 6. The glass cover/solar cell mounting arrangement advantageously is removable from receiver 10 for repair or replacement without interrupting circulation through coolant tube 25, simply by removing mounting clips 35, 35' securing the cover within channel 30. A thin layer 62 of thermal grease, such as type TC-7 produced by Emerson and Cuming, Inc. is preferably disposed between underside face 15b of each cell and abutment surface 34b to enhance heat transfer to extrusion 20.

To electrically insulate solar cells in string 15 from extrusion 20 and coolant tube 25, the surface of the extrusion, particularly abutment surface 34b, is anodized to a sufficient depth to provide a standoff voltage capability of approximately 20 volts. The thin anodized layer of surface 34b advantageously permits excellent heat transfer from cell string 15 to extrusion 20, particularly when thermal grease layer 62 is disposed between solar cell undersides 15b and surface 34b.

The primary means for electrically insulating solar cell strings 15 from coolant tube 25 is provided by a layer 64 of dielectric material disposed between the extrusion and coolant tube within channel 40, as best illustrated in FIG. 2. A suitable dielectric material forming layer 64 includes tape 670, which is a pressure-sensitive tape manufactured by The 3M Corporation, or a B-stage epoxy-impregnated glass tape manufactured by General Electric Company.

These electrically insulating materials in receiver 10 are relatively low in cost compared to alumina or beryllia as used in prior art receivers and cooperate with the geometry of extrusion 20 to permit excellent heat transfer from each cell string 15 to coolant tube 25. Since aluminum extrusion 20 has excellent thermal conductivity characteristics, the high heat flux at the point of contact between the solar cells and extrusion surfaces 34b tends to be diffused with little temperature drop throughout the extrusion body. This is because the thin anodized layer of surface 34b permits excellent heat transfer from strings 15 to extrusion 20 while providing the above standoff voltage characteristic as described hereinafter. Heat diffused through extrusion 20 is then transferred across the dielectric joint 64 to coolant tube 25. Since the dielectric joint 64 has a relatively larger surface area due to its semi-cylindrical shape (i.e., channel 40) than the cell to extrusion area (i.e., flat surface 34b), temperature drops across the dielectric joint are accordingly smaller. Additionally, due to temperature diffusion in the extrusion material, i.e., aluminum, the temperature drops across dielectric joint 64 are also more uniform than those occurring at the high flux gradient area of the solar cells (i.e., surface 34b).

In accordance with another important feature of the invention, V-shaped extrusion 20 also serves as a current path in the receiver electrical design. As schematically illustrated in FIG. 3, the midpoint of each cell string 15 (i.e., between the twelfth and thirteenth cells) is electrically connected to extrusion 20 below the anodized surface 34b. Bypass diodes 68a and 68b are connected respectively from the cell string 15 (+) and (−) terminals to the extrusion. Extrusion 20 thus serves as a current bypass path should any single cell become open-circuited or shadowed from sunlight. An example of a current bypass path is shown by the arrow in FIG. 3 with the string of cells 16-24 assumed to be open circuited or shadowed. Since each bypass diode 68a, 68b protects twelve series solar cells within a string 15 and extrusion 20 is connected to have the potential of the string midpoint, the most extreme cells have potential differences no greater than approximately 6 to 8 volts with respect to the extrusion. Thus, the standoff voltage capability of anodized layer 34b of approximately 20 volts, as mentioned above, is sufficient to prevent the extrusion from establishing a current path unless the cells are open-circuited or shadowed. Since these connections are the only connecting points between cell string 15 and extrusion 20, thermal expansion is unimpeded.

As mentioned above, another important feature for accomodating thermal expansion within receiver 10 is the bonding of a solar cell string 15 to glass cover 22, functioning as a superstrate free to expand without constraint. To further accommodate thermal expansion of the solar cells and thermal expansion mismatches therebetween, interconnect members 60 are used to connect the lower side 15b of one solar cell to the upper side 15a of an adjacent solar cell. As illustrated in FIGS. 4 and 4A, each interconnect member 60 is a nickel-plated and tin-plated etched copper pattern having a solar cell lower surface contacting section 60a and an upper surface contacting section 60b integrally formed adjacent and coplanar with each other. Section 60a is dimensioned to fully contact solar cell surface 15b soldered thereto along the center one-third of the cell width. A plurality of equispaced, alternating slots 61a and 61b extending transversely along section 60a permit expansion and contraction of the pattern so that minimal thermal stresses are induced in the connected solar cells.

The upper side contacting section 60b includes a pair of parallel arms 63 extending longitudinally from the lower side contacting section 60a. The arms 63 are spaced apart from each other to receive the lower side contacting section 60a of an adjacent interconnect member (shown in phantom lines). Each arm 63 includes a plurality of parallel, upper surface contacting fingers 63a equispaced along the arms. The fingers 63a project outwardly from arm 63 and are doubled over (see FIG. 4A) to contact the upper side 15a of an adjacent solar cell (shown in phantom), interpositioned between the arms, thereby interconnecting the cells in series within the string.

These fingers 63a advantageously accommodate the thermal mismatch of the solar cells as well as that of the interconnect member. Additionally, interconnection of adjacent solar cells with interconnect members 60 in the above manner assures that the solder contact areas are kept small to minimize displacement associated with thermal mismatching, thus facilitating use of low cost copper interconnection materials. In addition, by soldering lower side contacting sections 60a to the center one-third of the lower side 15b of a cell, at the region of greatest heat flux, maximum direct heat transfer to extrusion 20 as well as maximum lateral heat transfer to the extrusion is established.

To minimize manufacturing costs of receiver 10, a soldering jig 75 is used to solder the solar cells to their interconnects 60 while maintaining the lower surfaces 15b of the cells flat to assure good thermal contact with extrusion 20. As illustrated in FIG. 5, a jig 75 comprises a rectangular solid block fixture 77 preferably formed from aluminum and having an upper surface that includes a channel 79 extending longitudinally to receive a solar cell and an associated interconnect member. Channel 79 includes parallel sidewalls 79a spaced apart from each other to engage outer curved portions of fingers 63a for accurately positioning section 60b of an interconnect member 60 within the channel. A planar surface 79c extending between sidewalls 79a includes a pair of parallel ridge members 81 projecting upwardly therefrom to define cell position stops. Ridges 81 respectively include vertical, inwardly directed stop surfaces 81a laterally spaced from each other to contact side edges of lower side contacting sections 60a of an interconnect member and corresponding edges of the solar cell to maintain the lower side 15b of a cell in full registration with the interconnect 60. Ridges 81 also respectively include vertical, outwardly directed surfaces 81b laterally equispaced from sidewalls 79a, respectively to maintain arms 63 of one section 60b of an interconnect member 60 laterally spaced from the section 60a of an adjacent interconnect located between the ridges, enabling fingers 63a to accurately engage upper side 15a of the solar cell.

A transparent weight member 83, preferably quartz, is then positioned on the solar cell/interconnect arrangement positioned in accurate alignment within channel 79 to press the cell/interconnect contact surfaces described above into complete engagement. The weighted soldering fixture 77 is then conveyed through a zoned temperature tunnel oven (not shown in detail) wherein an infrared heat source 85 transmits heat through weight 83 to heat solder previously disposed between the cells and interconnects in the manner described above. A complete cell string 15 fully interconnected in series with interconnects 60 emerges from the tunnel oven.

To bond solar cell string 15 to glass cover 22, a bonding fixture 85, preferably Teflon, includes a main channel 87 formed in an upper surface thereof to receive the soldered cell string/interconnect arrangement in proper registration with the cover. As illustrated in FIG. 6, channel 87 extends longtudinally and includes parallel sidewalls 87a laterally spaced to engage side edges of cover 22. A flat, upwardly directed bottom channel wall 89 extends between sidewalls 87a. A pair of parallel, longitudinally extending ridges 91 project upwardly from the bottom wall 89 and respectively includes vertical, inwardly facing alignment surfaces 91a laterally spaced to engage outer curved portions of fingers 63a when the cell/interconnect arrangement is positioned with the channel. The surfaces 91a are laterally spaced from sidewalls 87a to center cell string 15 in contact with cover 22. Ridges 91 further include horizontal stop surfaces 91b respectively, vertically spaced between bottom wall 89 and the top of channel 87 to position cover 22 resting on the stop surfaces at the proper height necessary to assure proper buildup of bond layer 61 to specified tolerances so that antimoisture seals 36 function properly.

Ridges 91 further include downwardly inclined surfaces 93a facing sidewalls 87a respectively, to define outer runoff channels 95 therewith. The channels 95 cooperate with alignment ridges 91 to assure proper buildup of bond layer 61, as mentioned above. A plurality of vacuum ports 97 formed in bottom wall 89 are connected to a suitable vacuum pump (not shown) to assist in accurate, flat positioning of the cell string within channel 87.

To achieve the proper composite thickness of cell string 15 and bond layer 61 and accurate alignment with cover 22, the cell/interconnect arrangement is first positioned within channel 87 so that cell undersides 15b rest on a tape layer 99 disposed on bottom wall 89. Tape layer 99, preferably metallic tape, provides a temporary bond to assist vacuum ports 97 in maintaining the cells in stationary position during the bonding process. Clear silicon rubber or an alternative transparent adhesive is then poured onto the cell/interconnect arrangement to cover cell topsides 15a. Glass cover 22 is then lowered into contact with the wet adhesive material in accurate alignment with the underlying cells due to engagement of the cover side edges with sidewalls 87a. As cover 22 is pressed against stop surfaces 91b, excess bond material flows outwardly from between the cover and cells into runoff channels 95, thereby assuring proper buildup and thickness of the cell/bond layer. In this manner, after the adhesive layer has cured, cover 22 can then be removed from fixture 85 for mounting within extrusion channels 30 of receiver 10 so that cell undersides 15b evenly and fully engage heat transfer surface 34b when the cover is pressed into sealing engagement with seals 36 via spring clips 34.

In summary, the novel configuration of receiver 10 is capable of maximizing heat transfer from cell strings 15 to coolant tube 25 without giving rise to significant temperature drop adverse to solar cell operation by providing primary electricaly insulation in the form of low cost dielectric tape 64 disposed between extrusion 20 and the tube. The anodized surface 34b in heat transfer contact with cell strings 15 permits excellent heat transfer from the cells to extrusion 20 (enhanced by inexpensive thermal grease layer 62) while providing a sufficient standoff voltage capability between the cells and extrusion. In the event of cell malfunction or shadowing, extrusion 20 functions as a current bypass path.

The attachment of cell string 15 to glass cover 22 mounted on extrusion 20 with spring clips 35, 35' permits thermal expansion to occur without substantial restraint. Additionally, the aforesaid design and attachment of interconnects 60 to the solar cells further serves to accommodate thermal expansion and mismatches so that only minimal stresses are induced in the solar cells.

Receiver 10 also lends itself to ease of repair and replacement. As explained above, the glass cover/cell string assembly is easily separated from extrusion 20 by removing spring clips 35, 35', providing full access to the cell interconnect arrangement. Additionally, extrusion 20 housing the installed cover/string assembly is easily removed without interrupting the coolant fluid lines simply by unclamping means 41 from coolant tube 25, avoiding complicated procedures associated with coolant drain down.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, depending on available sunlight conditions and/or power requirements of the solar operated facility, it may be desirable to assemble receiver 10 in the form of a series of individual extrusions 20, each containing a continuous glass cover 22 of predetermined length. By forming the extrusion and continuous glass cover in five-foot lengths, for example, to build-up to the necessary receiver size, greater ease of transportation to the construction site is obtained. In addition, since cover 22 is formed as a single uninterrupted member corresponding in length to extrusion 20, the use of segmented cover slides as found in the prior art is eliminated, minimizing entry of moisture into the receiver. The embodiment was chosen and described to provide the best illustration of the principles of the invention and its practical application to thereby enable one of ordinary skill in the art to utilize the invention in various embodiments and with various modifications as are suited to the particular use contemplated. It is intended that the scope of the invention be defined by the claims appended hereto.

I claim:

1. A liquid cooled, linear focus solar cell receiver, comprising:
   (a) a plurality of solar cells electrically connected in series with each other, each cell having an exposed side to absorb light impinging thereon;
   (b) a heat conductive member having a surface in thermal contact with an opposite of each cell;
   (c) a coolant tube adapted to be charged with coolant fluid, said tube being in thermal contact with the heat conductive member;
   (d) dielectric material means positioned between said heat conductive member and coolant tube to electrically insulate the tube from the heat conductive member;
   (e) transparent cover means mounted on the heat conductive member to isolate the solar cells from the external environment, said solar cells being attached to said cover means at their exposed sides; and
   (f) means for releasably securing said cover means in sealing engagement with said conductive member, said releasable securing means facilitating easy removal of the cover means and attached solar cells from the receiver for repair or replacement without interrupting circulation of coolant fluid through the tube.

2. The receiver of claim 1, wherein said heat conductive member is a V-shaped extrusion having a pair of outer faces each formed with a channel extending longitudinally to receive a plurality of series connected solar cells therewithin.

3. The receiver of claim 2, wherein each channel includes a pair of substantially parallel side walls and a bottom wall defining a pair of support surfaces to respectively receive and support corresponding side edges of said cover means, said bottom wall also having a substantially flat abutment surface extending between and below the support surfaces to thermally contact undersides of said solar cells when the cover means is mounted within the channel.

4. The receiver of claim 3, wherein said securing means includes spring clip means having one end retained within anchoring holes formed in the extrusion and an opposite end pressing the cover into the channel, said clip means being easily detachable from the anchoring hole to thereby facilitate removal of the cover and attached cells from the receiver.

5. The receiver of claim 3, wherein said flat abutment surfaces are anodized to a sufficient depth to provide a predetermined standoff voltage capability between the cells and extrusion, thereby electrically insulating the cells from the extrusion without substantially affecting heat transferability therebetween.

6. The receiver of claim 2, wherein said extrusion further includes a concave channel extending lengthwise along interior surfaces of the extrusion and further including clamping means for clamping said coolant tube into said channel in thermal contact with the extrusion.

7. The receiver of claim 6, wherein said clamping means includes a curved retainer clip facing the concave channel to define a dead air space therebetween, a clamping screw attached to said retainer clip and acting upon a clamping strip engaging outer surfaces of the tube, said retainer clip having hooked ends engaging inwardly extending projections of the extrusion to thereby urge the clamping strip against the tube when the clamping screw is tightened.

8. The receiver of claim 7, further including electrically grounded cover means enveloping outer surfaces of the extrusion, and insulation means disposed between the cover means and retainer clip to prevent thermal leakage from a rear portion of the receiver.

9. The receiver of claim 8, further including a nose shield covering an upper apex of the extrusion.

10. The receiver of claim 1, further including at least one interconnect member for electrically connecting adjacent solar cells in series with each other, said interconnect member having one portion engaging said opposite side of one solar cell and another portion having fingers curved to electrically contact the exposed side of an adjacent solar cell.

11. The receiver of claim 10, wherein said one portion of said interconnect member includes a plurality of transversely extending alternating slots permitting expansion and contraction of the interconnect member so that minimal stresses are induced in the connected solar cells.

12. The receiver of claim 11, wherein said another portion of said interconnect member includes a pair of arms extending longitudinally from said one portion, said arms being substantially parallel to each other and spaced apart from each other by a distance greater than the width of said one portion to thereby receive a solar cell without contacting said one portion of an adjacent interconnect member and an adjacent solar cell juxtaposed thereon.

13. The receiver of claim 12, wherein said one portion is soldered to a corresponding solar cell substantially only within the center one-third of the cell width, thereby resulting in maximum heat transfer to the heat conductive member located therebelow and maximum lateral heat transfer to extended interconnect member portions.

14. The receiver of claim 3, wherein said series connected solar cells define a cell string of approximately 24 cells mounted within the extrusion channel, wherein adjacent cells located at approximately the midpoint of the string are electrically connected to the extrusion, thereby enabling the extrusion to function as a current bypass path in the event of cell malfunction or shadowing.

15. The receiver of claim 14, wherein said cover means includes an uninterrupted length of glass extending continuously to cover the full length of the cell string.

16. A liquid cooled, linear focus solar cell receiver, comprising:

(a) a plurality of solar cells electrically connected in series with each other to define a photovoltaic cell string;

(b) a heat conductive member having an outer face formed with a channel dimensioned to receive said cell string in heat exchange contact with an outer surface of the channel, said outer surface being anodized to electrically insulate said cells from the member without substantially affecting heat transfer therebetween, said member further including a second channel formed on an inner surface thereof to receive a coolant tube in thermal contact with the second channel;

(c) a transparent cover mounted in sealing engagement within the outer face channel to isolate the solar cell string from the external environment; and (d) dielectric tape means disposed within the second channel to electrically insulate the coolant tube from the heat conductive member and cell string.

* * * * *